(12) United States Patent
Liu et al.

(10) Patent No.: US 6,621,376 B2
(45) Date of Patent: Sep. 16, 2003

(54) MULTIBAND MATCHING CIRCUIT FOR A POWER AMPLIFIER

(75) Inventors: Shih-Ping Liu, Kaouhsiung (TW);
Yung-Nien Chiu, Hualien (TW);
Tseng-Chuan Wang, Taipei (TW)

(73) Assignee: Industrial Technology Research Institute (TW)

( * ) Notice: Subject to any disclaimer, the term of this patent is extended or adjusted under 35 U.S.C. 154(b) by 0 days.

(21) Appl. No.: 09/945,827

(22) Filed: Sep. 5, 2001

(65) Prior Publication Data

US 2003/0011443 A1 Jan. 16, 2003

(30) Foreign Application Priority Data

Jul. 4, 2001  (TW) ........................... 90116334 A

(51) Int. Cl.[7] ........................... H01P 1/213; H01P 5/12; H03H 7/38
(52) U.S. Cl. ........................... 333/126; 333/32
(58) Field of Search ........................... 333/126, 129, 333/193, 203, 195, 17.1; 330/277, 124 R, 251, 286, 302, 306, 51, 295; 331/48; 455/127, 553, 142

(56) References Cited

U.S. PATENT DOCUMENTS

| 5,774,017 A | * | 6/1998 | Adar ........................... 330/51 |
| 5,949,309 A | * | 9/1999 | Correa ........................... 333/202 |
| 5,969,582 A | * | 10/1999 | Boesch et al. ........................... 333/129 |
| 6,091,966 A | * | 7/2000 | Meadows ........................... 455/553 |
| 6,147,571 A | * | 11/2000 | Kitazawa et al. ........................... 333/126 |
| 6,392,491 B1 | * | 5/2002 | Ohkawa et al. ........................... 330/306 |

* cited by examiner

Primary Examiner—Patrick Wamsley
(74) Attorney, Agent, or Firm—Birch, Stewart, Kolasch & Birch, LLP

(57) ABSTRACT

An impedance-matching circuit for a multiband power amplifier, which uses an impedance-matching circuit with one-to-multiple path to efficiently transmit a radio frequency (RF) from an input port to the corresponding multi-ports without spurious effect. The impedance-matching circuit includes an input port for receiving a plurality of frequency band signals; a plurality of output ports for outputting the plurality of frequency band signals; and a plurality of frequency paths in which each path has an impedance matching network for matching an input port's impedance with its output port's impedance in a desired band; and a short circuit for filtering out RF signals in other remaining bands.

19 Claims, 4 Drawing Sheets

MULTIBAND MATCHING CIRCUIT FOR A POWER AMPLIFIER

BACKGROUND OF THE INVENTION

1. Field of the Invention

The invention relates to an impedance-matching circuit for a multiband power amplifier, using an impedance-matching circuit with one-to-multiple path to efficiently transmit a radio frequency (RF) from an input port to the corresponding multi-ports without spurious effect.

2. Description of Related Art

In wireless communication, multiband operation is widely employed. Typically, a power amplifier is used to operate in different bands, as shown in FIG. 1. In addition, the structure of one power amplifier per band can be used (not shown). As shown in FIG. 1, a dual-band GSM/DCS radiotelephone with a power amplifier 120 can use both the Global System for Mobile Communications (GSM), which operates at 900 MHz, and the Digital Communications System (DCS), which is similar to GSM except that it operates at 1800 or 1900 MHz. Such a structure can save costs but the circuitry is complicated. In this example, the amplifier 120 outputs the proper impedance, e.g. 50 Ω, matched to the impedance of the multiband antenna through the matching circuit 140 so that the input signal 110 generates the proper operating power output 151, 152. For this purpose, switches or resonators are added to the matching circuit. Thus, the circuit becomes more complicated.

Accordingly, multiple output ports are further employed. For this example, the use of multiple output ports has the advantage of easily connecting different filters and transmitting/receiving signal from switch. To build up a multiband-matching network with multiple output ports, a separate, switched highpass- and lowpass-matching network is utilized with output from an amplifier. However, such a structure requires a switch with power handling capability and lower insertion loss, occupying more space and raising costs.

Therefore, a solution is further subjected to the switch problem. Different operating band resonators are used in the multiband application of multiple transmitting paths (U.S. Pat. No. 5,969,582). However, a problem in this circuitry design is lack of flexibility.

SUMMARY OF THE INVENTION

Accordingly, an object of the invention is to provide a multiband matching circuit with an input port and multiple output ports, which has the feature of circuitry flexibility to create the best impedance matching.

The invention provides a multiband matching circuit with an input port and multiple output ports. The matching circuit includes a plurality of frequency paths; and a short circuit for filtering out the RF signals in other remaining bands. The reactance used in every path provides different bands with different amplitudes and signs (inductance or capacitance) so that the buffer resonator is generated with the preferred flexibility of multiband match.

BRIEF DESCRIPTION OF THE DRAWINGS

The invention will become apparent by referring to the following detailed description of a preferred embodiment with reference to the accompanying drawings, wherein.

DETAILED DESCRIPTION OF THE INVENTION

The following numbers denote the same elements throughout the description and drawings.

Figure 2:
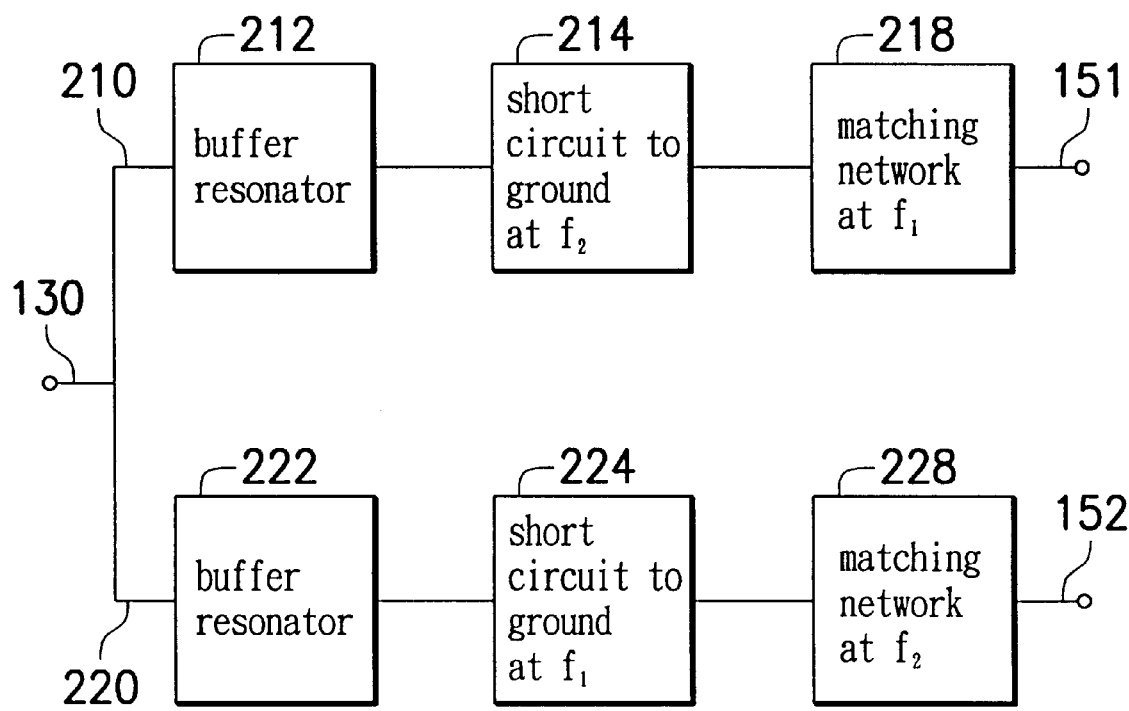
FIG. 2 is a block diagram illustrating a multiband impedance-matching circuit of the invention.

FIG. 2 is a block diagram illustrating a multiband impedance-matching circuit of the invention. In FIG. 2, a dual band impedance-matching circuit is explained as an example for the sake of clarity. The circuit includes three parts: a buffer resonator (212, 222); a short circuit to ground (214, 224); and a matching network (218, 228). The buffer resonator provides different signs of reactance in different bands for multiple functions. The buffer resonator can be a resonant circuit, rather than the use of an open or short circuit in the undesired band as seen in the prior art, as a bridge or buffer between the short circuit to ground and the input port to prevent the desired signals from being reflected by the short circuit to ground. The short circuit to ground is a trap circuit used to filter out radio frequency (RF) signals in the undesired band and can be implemented by a series resonant circuit to ground, a quarter wavelength open stub or a half wavelength short stub or others. The matching network is used to transfer RF signals in the desired band and can be an L type, pi type, T type, ladder type network and others.

Figure 1:
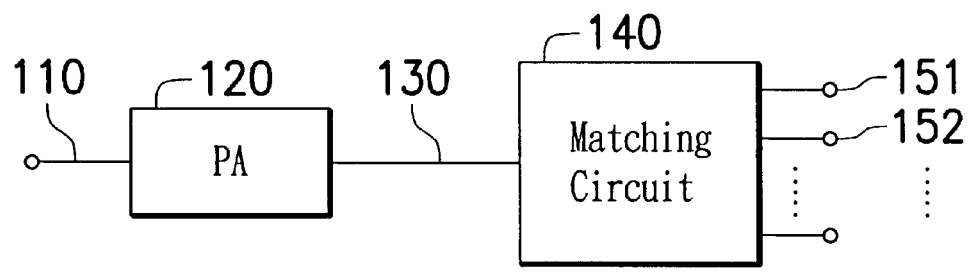
FIG. 1 is a schematic diagram illustrating a typically partial transmitter having a multiband matching circuit and a power amplifier.

As shown in FIG. 2, the signal 130 from the power amplifier of FIG. 1 is separated into a first band path 220 and a second band path 210. The first band path 220 passes through a first buffer resonator 222, a first short circuit to ground 224 at the frequency $f_1$, and a first matching network 228 at $f_2$, to output a first operating band 152. Likewise, the second band path 210 passes through a second buffer resonator 212, a second short circuit to ground 214 at $f_2$, and a second matching network 218 at $f_1$, to output a second operating band 151. Examples of the first and second operating band 152, 151 are a dual band radiotelephone with the operating band 900/1800 MHz for Taiwan and the 900/1900 MHz for North America. The following circuits are embodied in detail according to the invention.

[First Embodiment]

Figure 3A:
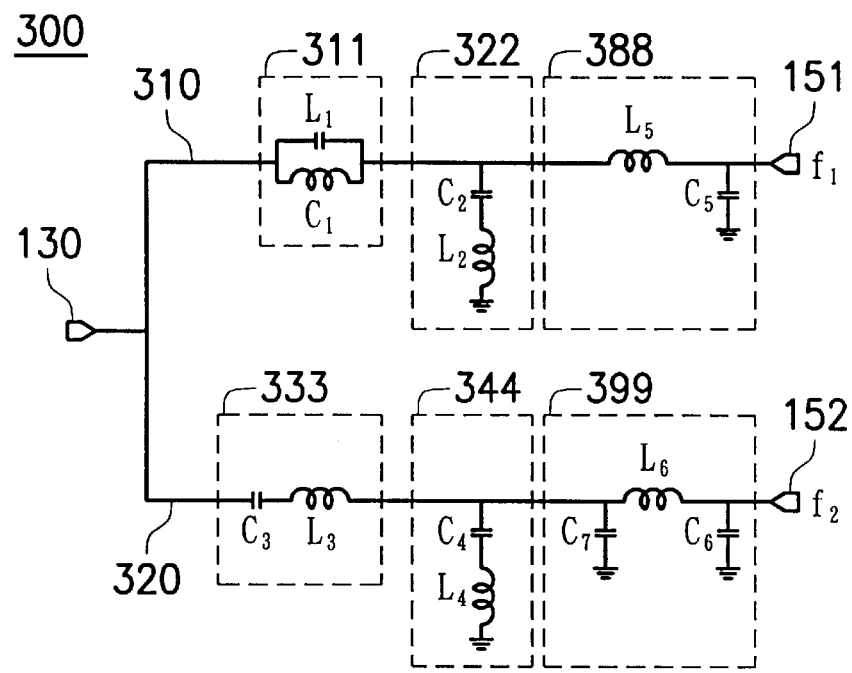
FIG. 3(a) is an embodiment of a dual band matching circuit of the invention.

FIG. 3(a) shows one embodiment of the present invention for impedance matching in a dual-band power amplifier. The dual-band matching circuit 300 has a first path 310 to transfer RF signals in $f_1$ band to an output port 151 and a second path 320 to transfer RF signals in $f_2$ band to an output port 152. Frequency $f_1$ is lower than $f_2$.

Path 310 includes a parallel resonant circuit 311 composed of inductor L1 and capacitor C1, a series resonant circuit 322 composed of inductor L2 and capacitor C2, and a matching network including a series inductor L5 and a shunt capacitor C5. Resonant circuit 322 in path 310 resonates at $f_2$ band and provides a bandstop notch at a predetermined frequency of $f_2$ band. Appropriate notch bandwidth should be applied according to the system specification. This series resonant circuit 322 provides a high reflection to $f_2$ band and hence prevents $f_2$ band signal coupled to output port 151. Furthermore, it also isolates the load connected at port 151 from path 320 such that the impedance presented in input port 130 at $f_2$ band is not affected by the load at port 151. On the other hand, resonant circuit 322 exhibits capacitance in $f_1$ band, which is then viewed as a matching element. In resonant circuit 311, inductor L1 and capacitor C1 are chosen such that circuit 311 resonates between $f_1$ and $f_2$ and consequently presents inductance in $f_1$ band and capacitance in $f_2$ band.

Path 320 includes a series resonant circuit 333 composed of inductor L3 and capacitor C3, a series resonant circuit 344 including inductor L4 and capacitor C4, and a matching network 399 including a series inductor L6 and two shunt capacitors C6 and C7. Similarly to path 310, resonant circuit 344 in path 320 resonates in $f_1$ band and provides a bandstop notch at a predetermined frequency of $f_1$ band, which provides a high reflection to fband and hence prevents $f_1$ band signal coupled to output port 152. Furthermore, it also isolates the load connected at port 152 from path 310 such that the impedance presented to input port 130 in $f_1$ band is not affected by the load at port 152. Meanwhile, resonant circuit 344 exhibits inductance in $f_2$ band, which is then viewed as a matching element. In resonant circuit 333, inductor L3 and capacitor C3 are selected such that circuit 333 resonates between $f_1$ and $f_2$ and consequently presents capacitance in $f_1$ band and inductance in $f_2$ band.

Figure 3B:
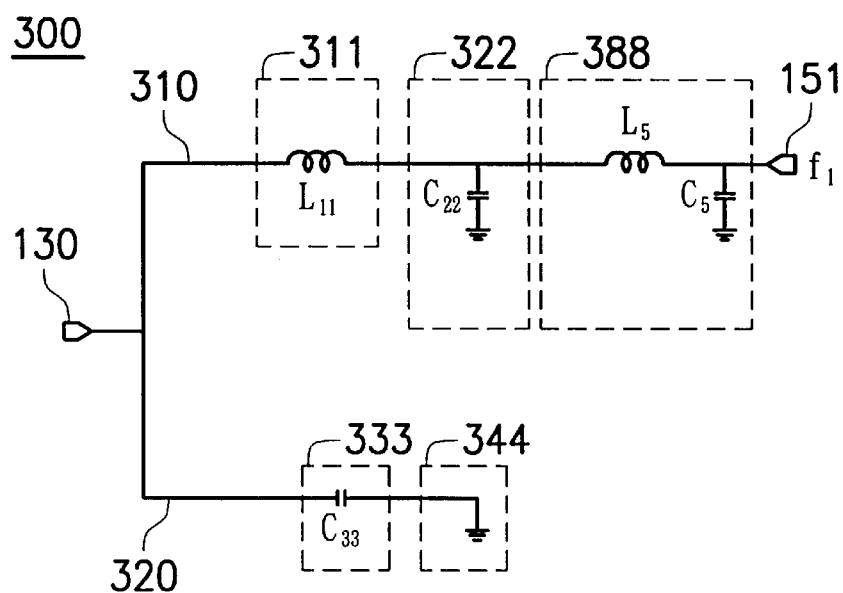
FIG. 3(b) is an equivalent circuit of FIG. 3a operated in one band.

When a signal in $f_1$ band is input to port 130 of FIG. 3(a), the equivalent circuit is shown in FIG. 3(b). The buffer-resonator 311 in path 310 formed by inductor L1 and capacitor C1 functions as a series inductor L11. The series resonant circuit 322 formed by inductor L2 and capacitor C2 functions as a shunt capacitor C22. In path 320, the series resonant circuit 344 formed by inductor L4 and capacitor C4 resonates as a short circuit to ground and prevents $f_1$ signal coupled to output port 152. Therefore, the buffer-resonator circuit 333 formed by inductor L3 and capacitor C3 functions as a shunt capacitor C33. It is noted that $f_1$ signal will short-circuit at the input port 130 in the absence of buffer-resonator circuit 333. As a result, the series inductor L11 and shunt capacitors C22, C33 combined with network L5 and CS form a low pass matching network to provide a 50 ohm impedance match to the desired load at port 130 in $f_1$ band.

Figure 3C:
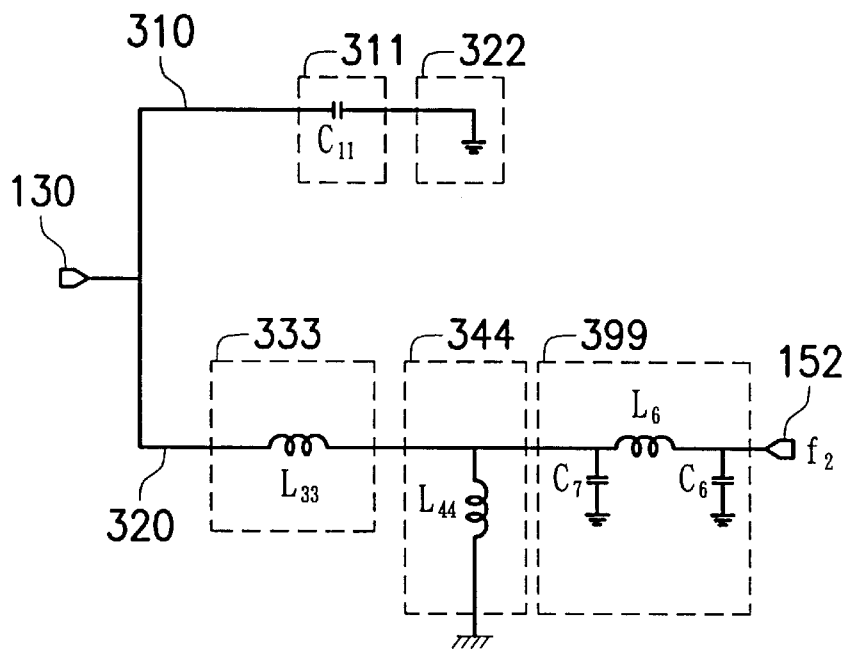
FIG. 3(c) is an equivalent circuit of FIG. 3a operated in the other band.

When a signal in $f_2$ band is input to port 130 of FIG. 3(a), the equivalent circuit is shown in FIG. 3(c). In path 320, the buffer-resonator 333 formed by inductor L3 and capacitor C3 functions as a series inductor L33, while the series resonant circuit 344 formed by inductor L4 and capacitor C4 functions as a shunt inductor L44. In path 310, the series resonant circuit 322 formed by inductor L4 and capacitor C4 resonates as a short circuit to ground and prevents $f_2$ signal coupled to output port 151. Therefore, the buffer-resonator circuit 311 formed by inductor L1 and capacitor C1 functions as a shunt capacitor C11. It is obvious that $f_2$ signal would be short-circuited at the input port 130 under the absence of buffer-resonator circuit 311. As a result, the series inductor L33 and shunt capacitors C11 combined with network L44, C6, L6 and C7 form a low pass matching network to provide a 50 ohm impedance match to the desired load at port 130 in $f_2$ band.

The buffer-resonator circuit 311 in path 310 formed by inductor L1 and capacitor C1 is applied to resonate between $f_1$ and $f_2$ operating bands. Therefore, circuit 311 functions like a series inductor L11 in $f_1$ band as shown in FIG. 3(b), and like a series capacitor C11 in $f_2$ band as shown in FIG. 3(c). Similarly, the buffer-resonator circuit 333 in path 320 formed by inductor L3 and capacitor C3 is also designed to resonate between two operating bands $f_1$ and $f_2$. Circuit 333 functions like a series capacitor C33 in $f_1$ band as shown in FIG. 3(b), and like a series inductor L33 in $f_2$ band as shown in FIG. 3(c). Appropriate choice of C1, L1, C3, and L3 can provide desired values of L11, C11, L33, and C33 for optimum impedance matching. The degree of design flexibility is thus increased and the optimization of circuit performance can be achieved more easily. A dual-band GSM (900 MHz)/DCS (1800 MHz) system is described in the following example.

The impedance at port 130 seen by the power amplifier is 4.2 ohm, while the load impedance at port 151 and port 152 is 50 ohm.

| L1 = 0.63 nH; | C1 = 21 pF; | L2 = 0.7 nH; | C2 = 12 pF; |
| L3 = 1.6 nH; | C3 = 9 pF; | L4 = 15 nH ; | C4 = 2 pF; |
| L5 = 3.84 nH; | C5 = 5.8 pF; | L6 = 1.8 nH ; | C6 = 2.63 pF; |
| C7 = 7.8 pF; | | | |

The simulation result is shown in Appendix A, which presents low insertion loss and good performance in both GSM and DCS bands.

[Second Embodiment]

Figure 4:
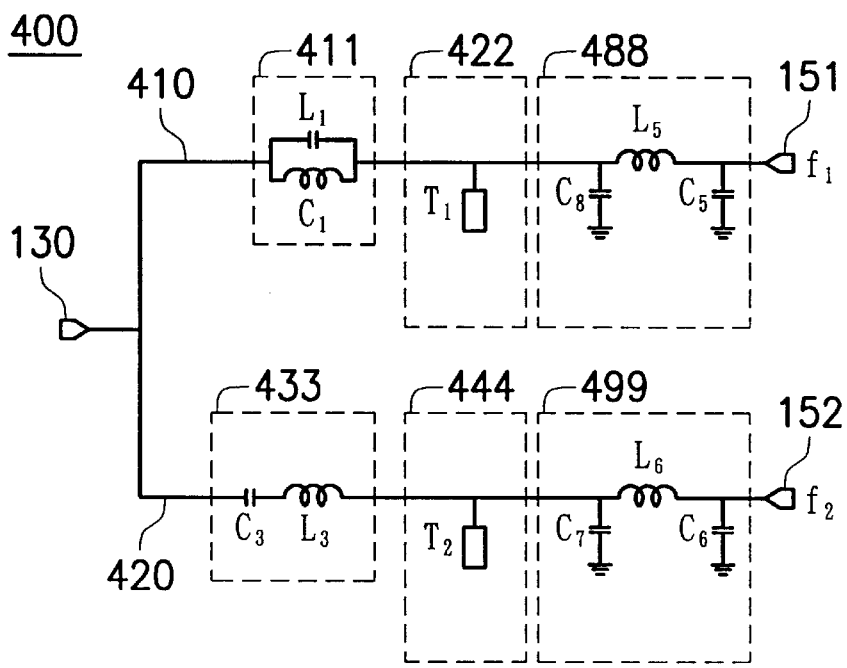
FIG. 4 is another embodiment of a dual band matching circuit of the invention.

FIG. 4 illustrates the second embodiment of the present invention for impedance matching in a dual-band power amplifier. The dual-band matching circuit 400 has a first path 410 to transfer RF signals in $f_1$ band to an output port 151 and a second path 420 to transfer RF signals in $f_2$ band to an output port 152. Frequency $f_1$ is lower than $f_2$. Paths 410 and 420 are substantially similar to paths 310 and 320 shown in FIG. 3(a), respectively, except that resonant LC circuit 322 is replaced with a shunt open stub T1 with a quarter wavelength at $f_2$ and resonant LC circuit 344 is replaced with a shunt open stub T2 with a quarter wavelength at $f_1$. An additional capacitor C8 in matching network 488 is used to facilitate impedance matching. The shunt open stub T1 can be viewed as a series resonator connected to ground, which resonates in $f_2$ band and exhibits capacitance in $f_1$ band. The shunt open stub T2 can also be viewed as a series resonator connected to ground, which resonates in $f_1$ band and may exhibit inductance or capacitance in $f_2$ band. The behavior of both the parallel resonant circuit composed of inductor L1 and capacitor C1, and the series resonant circuit composed of inductor L3 and capacitor C3, is identical to the previous descriptions associated with FIG. 3(a).

An example based on FIG. 4 for a dual-band GSM 900 MHz/DCS 1800 MHz system follows. The impedance at port 130 seen by the power amplifier is 4.2 ohm, while the load impedance at port 151 and port 152 is 50 ohm. T1 and T2 are realized using microstrip line structures.

| L1 = 0.61 nH; | C1 = 21 pF; | L3 = 1.7 nH; | C3 = 8 pF |
| L5 = 4.19 nH; | C5 = 6 pF; | C8 = 10 pF; | |
| L6 = 1.8 nH ; | C6 = 2.63 pF; | C7 = 7.8 pF; | |

Substrate thickness of T1 and T2=14.7 mil;
Relative dielectric constant of substrate=4.6;
T1 width=T2 width=20 mil; T1 length=920 mil;
T2 length=1780 mil;

The simulation results are plotted in Appendix B, which presents low insertion loss and good performance to meet the requirement of GSM/DCS dual-band applications.

[Third Embodiment]

Figure 5:
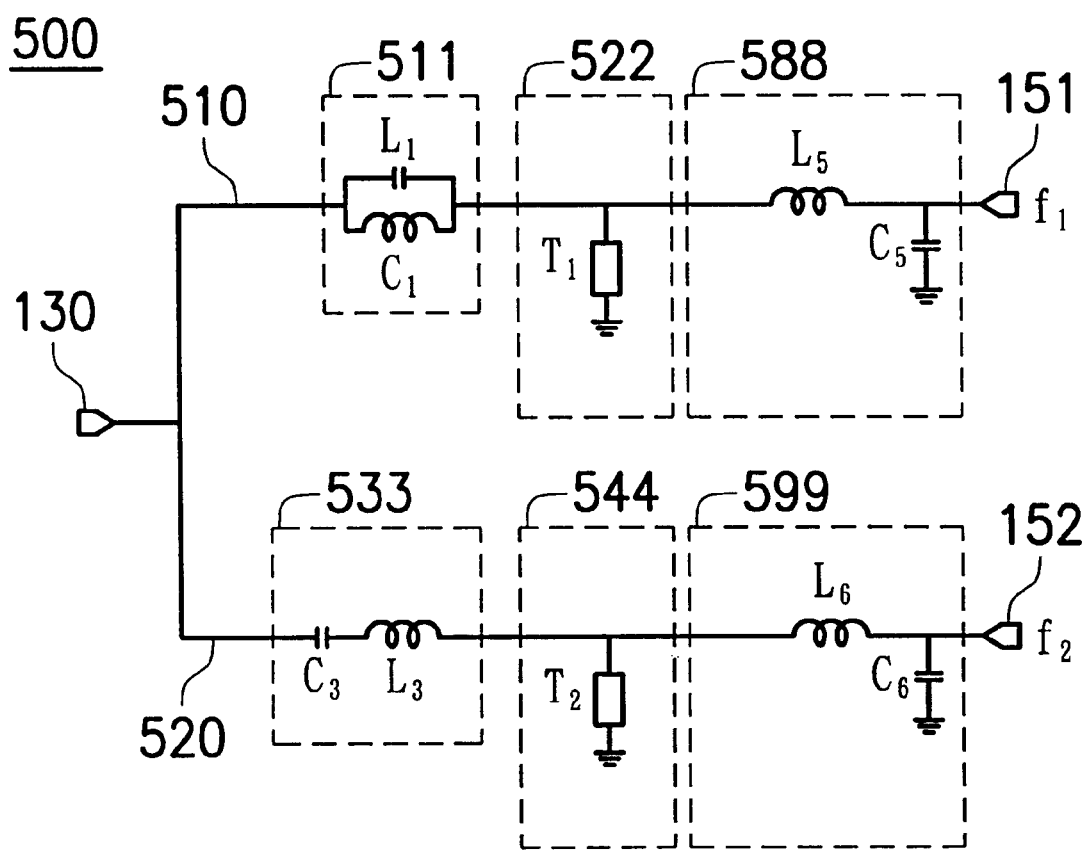
FIG. 5 is a further embodiment of a dual band matching circuit of the invention.

FIG. 5 illustrates the second embodiment of the present invention for impedance matching in a dual-band power amplifier. The dual-band matching circuit 500 has a first path 510 to transfer RF signals in $f_1$ band to an output port 151 and a second path 520 to transfer RF signals in $f_2$ band to an output port 152. Frequency $f_1$ is lower than $f_2$. Paths 510 and 520 are substantially similar to paths 410 and 420 as shown in FIG. 4, respectively, except that open stub 422 is replaced with a shunt short stub of a half wavelength at $f_2$ and open stub 444 is replaced with a shunt short stub of a half wavelength at $f_1$. The shunt short stub T1 can be viewed as a series resonator connected to ground, which resonates in $f_2$ band and may exhibit capacitance or inductance in $f_1$ band. The shunt short stub T2 can also be viewed as a series resonator connected to ground, which resonates in $f_1$ band and may exhibit inductance or capacitance in $f_2$ band. It should be noted that, in applying the dual-band structure of FIG. 5, one must avoid a situation in which one operating frequency is a plurality of another operating frequency.

Although the present invention has been described in its preferred embodiment, it is not intended to limit the invention to the precise embodiment disclosed herein. Those who are skilled in this technology can still make various alterations and modifications without departing from the scope and spirit of this invention. Therefore, the scope of the present invention shall be defined and protected by the following claims and their equivalents.

What is claimed is:

1. A impedance-matching circuit for a multiband power amplifier, comprising an input port for receiving a plurality of frequency band signals; a plurality of output ports for outputting the plurality of frequency band signals; and a plurality of paths wherein each path has an impedance matching network for transforming its output port's impedance to the input port's impedance in a desired frequency band, and a shunt resonant circuit, connected to the impedance matching network for filtering out radio frequency signals in the remaining bands of the multiband system.

2. The impedance-matching circuit of claim 1, wherein every path further comprises a cascaded resonant circuit for providing reactance of different magnitudes and signs in different bands to allow more design flexibility in multiband matching.

3. The impedance-matching circuit of claim 2, wherein the cascaded resonant circuit comprises an inductor and a capacitor in parallel with one end connected to the input port.

4. The impedance-matching circuit of claim 2, wherein the cascaded resonant circuit comprises an inductor and capacitor in series with one end connected to the input port.

5. The impedance-matching circuit of claim 1, wherein the shunt resonant circuit is composed of an inductor and capacitor in series with one end connected to ground and the other end connected to the other end of the cascaded resonant circuit.

6. The impedance-matching circuit of claim 1, wherein the shunt resonant circuit is a transmission line with an open end.

7. The impedance-matching circuit of claim 1, wherein the shunt resonant circuit is a transmission line with a short end.

8. The impedance-matching circuit of claim 1, wherein the impedance matching network comprises a series inductance device connected with at least one shunt capacitance device, where one end of the inductance device is connected to the shunt resonant circuit while the other end is connected to the respective output port.

9. An impedance-matching circuit for a multiband power amplifier, comprising:

an input port for receiving dual band radio frequency signals and outputting the signals to corresponding output ports;

a first output path, having a first cascaded resonant circuit connected to the input port, a first shunt resonant circuit connected to the first cascaded resonant circuit, and an impedance matching network with first end connected to the first shunt resonant circuit and second end connected to the first output port;

a second output path parallel to the first output path, having a second cascaded resonant circuit connected to the input port, a second shunt resonant circuit connected to the second cascaded resonant circuit, and an impedance matching network with first end connected to the second shunt resonant circuit and second end connected to the second output port.

10. The impedance-matching circuit of claim 9, wherein the first cascaded resonant circuit comprises an inductance device and a capacitance device in parallel with one end connected to the input port.

11. The impedance-matching circuit of claim 9, wherein the second cascaded resonant circuit comprises an inductance device and a capacitance device in series with one end connected to the input port.

12. The impedance-matching circuit of claim 9, wherein the first shunt resonant circuit is composed of an inductance device and a capacitance device in series with one end connected to ground and the other end connected to the other end of the cascaded resonant circuit.

13. The impedance-matching circuit of claim 9, wherein the second shunt resonant circuit is composed of an inductance device and a capacitance device in series with one end connected to ground and the other end connected to the other end of the second cascaded resonant circuit.

14. The impedance-matching circuit of claim 9, wherein the first shunt resonant circuit is a transmission line with an open end and a length of quarter wavelength at second frequency.

15. The impedance-matching circuit of claim 9, wherein the second shunt resonant circuit is a transmission line with an open end and a length of quarter wavelength at first frequency.

16. The impedance-matching circuit of claim 9, wherein the first shunt resonant circuit is a transmission line with a short end and a length of half wavelength at second frequency.

17. The impedance-matching circuit of claim 9, wherein the second shunt resonant circuit is a transmission line with a short end and a length of quarter wavelength at first frequency.

18. The impedance-matching circuit of claim 9, wherein the first impedance matching network comprises a series inductance device connected with at least one shunt capacitance device, where one end of the inductance device is connected to the shunt resonant circuit while the other end is connected to the first output port.

19. The impedance-matching circuit of claim 9, wherein the second impedance matching network comprises a series inductance device connected with at least one shunt capacitance device, where one end of the inductance device is connected to the shunt resonant circuit while the other end is connected to the second output port.

* * * * *